US012183552B2

(12) United States Patent
Kobayashi et al.

(10) Patent No.: US 12,183,552 B2
(45) Date of Patent: Dec. 31, 2024

(54) SUBSTRATE PROCESSING APPARATUS

(71) Applicant: KELK Ltd., Hiratsuka (JP)

(72) Inventors: Atsushi Kobayashi, Hiratsuka (JP); Wataru Omuro, Hiratsuka (JP)

(73) Assignee: KELK Ltd., Hiratsuka (JP)

( * ) Notice: Subject to any disclaimer, the term of this patent is extended or adjusted under 35 U.S.C. 154(b) by 302 days.

(21) Appl. No.: 17/491,685

(22) Filed: Oct. 1, 2021

(65) Prior Publication Data

US 2022/0115215 A1 Apr. 14, 2022

(30) Foreign Application Priority Data

Oct. 13, 2020 (JP) ................................. 2020-172536

(51) Int. Cl.
*H01J 37/32* (2006.01)
(52) U.S. Cl.
CPC .. *H01J 37/32532* (2013.01); *H01J 37/32082* (2013.01); *H01J 37/32724* (2013.01); *H01J 2237/032* (2013.01); *H01J 2237/06375* (2013.01); *H01J 2237/3151* (2013.01)
(58) Field of Classification Search
None
See application file for complete search history.

(56) References Cited

U.S. PATENT DOCUMENTS

| 6,506,253 | B2 * | 1/2003 | Sakuma | C23C 16/45519 |
| | | | | 118/620 |
| 7,922,863 | B2 * | 4/2011 | Ripley | C23C 16/45565 |
| | | | | 118/723 MP |
| 10,475,626 | B2 * | 11/2019 | Collins | H01J 37/32357 |
| 11,145,490 | B2 * | 10/2021 | Yokota | H01L 21/768 |
| 2001/0035131 | A1 * | 11/2001 | Sakuma | H01L 21/67115 |
| | | | | 118/724 |
| 2006/0223315 | A1 * | 10/2006 | Yokota | H01L 21/67115 |
| | | | | 118/724 |
| 2007/0221130 | A1 | 9/2007 | Nozawa et al. | |
| 2016/0027672 | A1 * | 1/2016 | Asakawa | H01L 21/68785 |
| | | | | 156/345.37 |
| 2019/0228993 | A1 | 7/2019 | Zhang et al. | |
| 2022/0115215 | A1 * | 4/2022 | Kobayashi | H01J 37/32532 |

FOREIGN PATENT DOCUMENTS

| CN | 105304526 A | 2/2016 | |
| CN | 107919298 A | 4/2018 | |
| CN | 111952217 A | 11/2020 | |
| JP | S62-107439 U | 7/1987 | |
| JP | H01-287285 A | 11/1989 | |
| JP | 2011-029211 A | 2/2011 | |
| JP | 2016-536797 A | 11/2016 | |
| WO | 2005/117083 A1 | 12/2005 | |
| WO | WO-2015030947 A1 * | 3/2015 | ......... C23C 16/4401 |
| WO | 2018/064983 A1 | 4/2018 | |

OTHER PUBLICATIONS

Office Action mailed Jun. 4, 2024, issued for JP2020-172536 and English translation thereof.

* cited by examiner

*Primary Examiner* — Sylvia MacArthur
(74) *Attorney, Agent, or Firm* — Locke Lord LLP

(57) ABSTRACT

A substrate processing apparatus includes a chamber which has a processing room in which a substrate is processed, a cover which is provided in the processing room and is provided between the substrate and the chamber, and a heater which is provided only on the cover among the chamber and the cover and heats the cover.

5 Claims, 1 Drawing Sheet

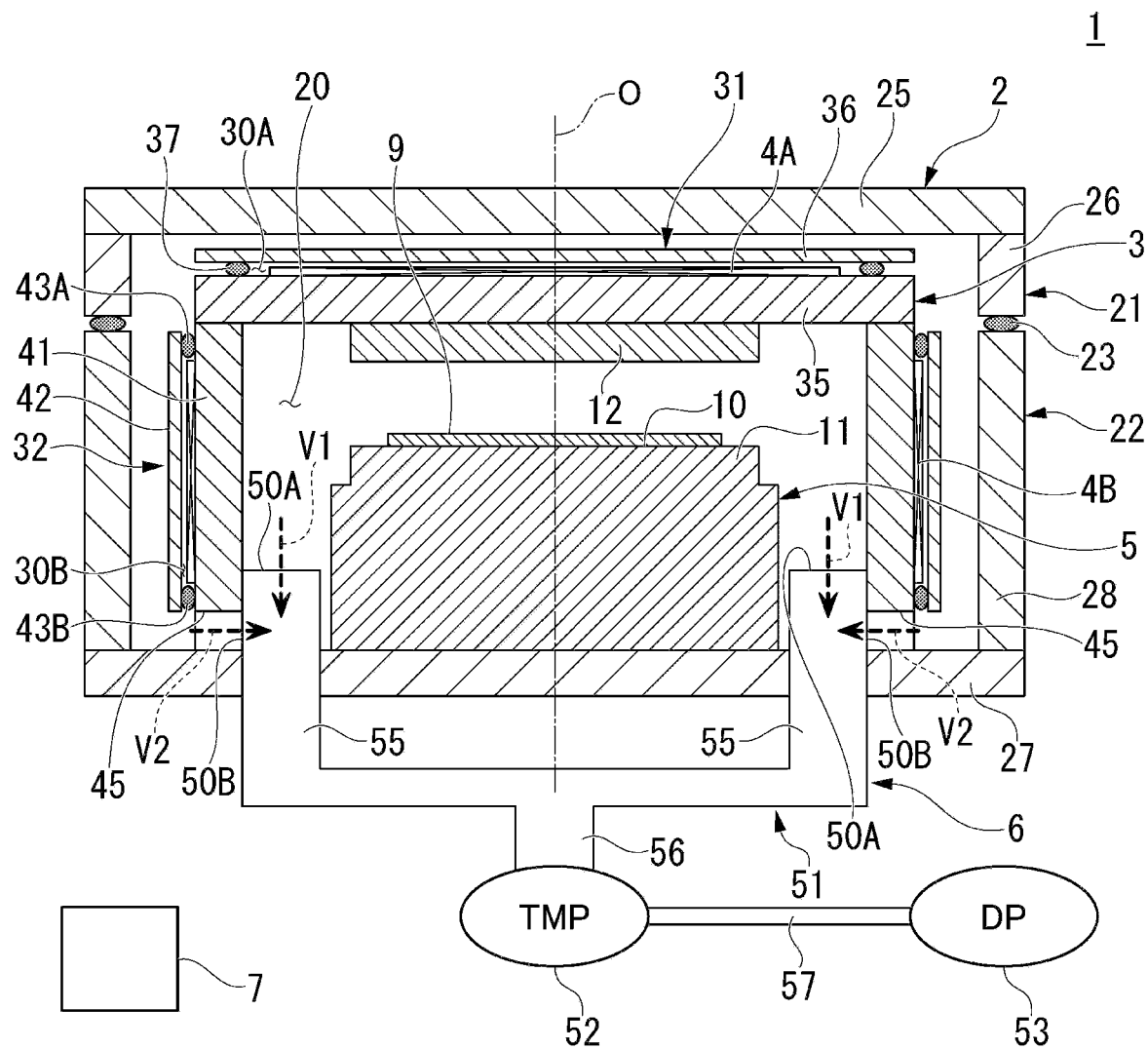

SUBSTRATE PROCESSING APPARATUS

CROSS-REFERENCE TO RELATED APPLICATION

Priority is claimed on Japanese Patent Application No. 2020-172536, filed Oct. 13, 2020, the content of which is incorporated herein by reference.

BACKGROUND

Field of the Invention

The present invention relates to a substrate processing apparatus.

Description of Related Art

As a substrate processing apparatus, for example, Published Japanese Translation No. 2016-536797 of the PCT International Publication discloses a configuration that includes a chamber main body surrounding a processing volume for processing a substrate, a heater plate, and a sleeve. The chamber main body includes a chamber floor, a chamber wall coupled to the chamber floor, and a chamber lid coupled to the chamber wall. The chamber floor, the chamber wall, and the chamber lid have passages for the flow of a heat control medium. The heater plate is provided adjacent to the chamber floor. The sleeve is supported by the heater plate.

SUMMARY

However, in a case in which a thick chamber main body is heated, much heat is dissipated, and thus wasteful energy (for example, electric power) may be consumed.

Therefore, an object of the present invention is to provide a substrate processing apparatus capable of saving energy.

A substrate processing apparatus according to an aspect of the present invention includes a chamber which has a processing room in which a substrate is processed, a cover which is provided in the processing room and is provided between the substrate and the chamber, and a heater which is provided only on the cover among the chamber and the cover and heats the cover.

According to the above aspect, it is possible to save energy.

BRIEF DESCRIPTION OF THE DRAWINGS

FIG. 1 is a cross-sectional view of a substrate processing apparatus of an embodiment.

DESCRIPTION OF EMBODIMENTS

Hereinafter, embodiments of the present invention will be described with reference to the drawings. In the embodiments, as an example of a substrate processing apparatus, an apparatus (a plasma etching apparatus) that etches a semiconductor wafer through a dry process using plasma will be described.

<Substrate Processing Apparatus>

As shown in FIG. 1, the substrate processing apparatus 1 includes a chamber 2, a cover 3, heaters 4A and 4B, a stage 5, a pressure adjusting device 6, and a control device 7. For example, the substrate processing apparatus 1 is provided on a horizontal installation surface (for example, a floor surface). Each element of the substrate processing apparatus 1 is controlled by the control device 7.

<Chamber>

The chamber 2 has a processing room 20 in which a substrate 9 is processed. The chamber 2 includes an upper case 21, a lower case 22 which is provided below the upper case 21, and a case connecting member 23 which connects the upper case 21 and the lower case 22 to each other. For example, the chamber 2 (the upper case 21 and the lower case 22) is formed of a metal such as aluminum.

For example, the upper case 21 is detachably attached to the lower case 22. The upper case 21 has a tubular shape that opens downward. The upper case 21 includes a chamber upper wall 25 provided above the cover 3 and a chamber upper peripheral wall 26 (a chamber peripheral wall) connected to an outer periphery of the chamber upper wall 25.

The chamber upper wall 25 is provided at a distance from an upper surface of an upper structure 31 of the cover 3.

The chamber upper peripheral wall 26 is provided at a distance from an outer periphery of the upper structure 31. The chamber upper peripheral wall 26 has a tubular shape that surrounds the upper structure 31. Hereinafter, a direction along a center line O of the chamber peripheral wall is referred to as an "axial direction," a direction orthogonal to the center line O is referred to as a "radial direction," and a direction around the center line O is referred to as a "circumferential direction."

The lower case 22 has a tubular shape that opens upward. The lower case 22 includes a chamber bottom wall 27 provided below the cover 3 and a chamber lower peripheral wall 28 connected to an outer periphery of the chamber bottom wall 27.

The chamber lower peripheral wall 28 has a tubular shape that is coaxial with the chamber upper peripheral wall 26. The chamber lower peripheral wall 28 overlaps the chamber upper peripheral wall 26 as a whole in the axial direction. The axial length of the chamber lower peripheral wall 28 is greater than the axial length of the chamber upper peripheral wall 26.

For example, the case connecting member 23 is an O-ring. The case connecting member 23 has an annular shape in the axial direction. The case connecting member 23 is provided between the chamber upper peripheral wall 26 and the chamber lower peripheral wall 28. The case connecting member 23 extends continuously over the entire length of the chamber upper peripheral wall 26 in the circumferential direction.

<Cover>

The cover 3 is provided in the processing room 20. The cover 3 is provided between the substrate 9 placed on the placement surface 10 and the chamber 2. The cover 3 prevents foreign matter generated in the processing of the substrate 9 (for example, etching processing) from adhering to the chamber 2. For example, examples of the foreign matter include scattered matter generated when the substrate 9 is etched, sublimated matter from an upper surface (a processing surface) of the substrate 9, and deposits deposited on the placement surface 10. The cover 3 surrounds the stage 5. The cover 3 has a tubular shape that opens downward.

The cover 3 has internal spaces 30A and 30B in which atmospheric pressure can be maintained. The cover 3 includes the upper structure 31 provided above the stage 5 and a lower structure 32 connected to the outer periphery of the upper structure 31. The cover 3 includes a top wall (a first top wall 35) constituting the upper structure 31 and a peripheral wall (a first peripheral wall 41) constituting the lower structure 32. Each of the internal spaces 30A and 30B is provided in one of the upper structure 31 and the lower structure 32. Hereinafter, the internal space 30A provided in the upper structure 31 is also referred to as an "upper space 30A," and the internal space 30B provided in the lower structure 32 is also referred to as a "lower space 30B."

The upper structure 31 includes the first top wall 35 (the top wall) that faces the upper surface of the substrate 9, a second top wall 36 that faces the first top wall 35, and a top wall side connecting member 37 that connects the first top wall 35 and the second top wall 36 to each other. The upper space 30A is a space defined by the first top wall 35, the second top wall 36, and the top wall side connecting member 37.

The first top wall 35 has a disk shape in the axial direction. The first top wall 35 is provided above the substrate 9. The first top wall 35 has an outer shape larger than that of the placement surface 10 in the axial direction.

The second top wall 36 has substantially the same disk shape as the first top wall 35 in the axial direction. The thickness of the second top wall 36 is smaller than the thickness of the first top wall 35. The second top wall 36 is provided above the first top wall 35.

For example, the top wall side connecting member 37 is an O-ring. The top wall side connecting member 37 has an annular shape in the axial direction. The top wall side connecting member 37 is provided between the first top wall 35 and the second top wall 36. The top wall side connecting member 37 continuously extends over the entire outer periphery of the first top wall 35.

The lower structure 32 includes the first peripheral wall 41 (the peripheral wall) that surrounds an outer periphery of the substrate 9, a second peripheral wall 42 that surrounds an outer periphery of the first peripheral wall 41, and a pair of peripheral wall side connecting members 43A and 43B that connect the first peripheral wall 41 and the second peripheral wall 42 to each other. The lower space 30B is a space defined by the first peripheral wall 41, the second peripheral wall 42, and the pair of peripheral wall side connecting members 43A and 43B.

The first peripheral wall 41 has a cylindrical shape extending in the axial direction. The first peripheral wall 41 is provided at a distance from an outer periphery of the stage 5. An upper end of the first peripheral wall 41 is connected to an outer periphery of a lower surface of the first top wall 35. A lower end of the first peripheral wall 41 is disposed below the placement surface 10. The lower end of the first peripheral wall 41 is connected to the chamber bottom wall 27. The first peripheral wall 41 has a plurality of (for example, three in the present embodiment) communication holes 45 (only two are shown in the drawing) that open in the radial direction.

The second peripheral wall 42 has a cylindrical shape that is coaxial with the first peripheral wall 41 in the axial direction. The thickness of the second peripheral wall 42 is smaller than the thickness of the first peripheral wall 41. An inner peripheral surface of the second peripheral wall 42 is provided at a distance from an outer peripheral surface of the first peripheral wall 41. A lower end of the second peripheral wall 42 is disposed above the chamber bottom wall 27.

For example, the peripheral wall side connecting members 43A and 43B are O-rings. Each of the pair of peripheral wall side connecting members 43A and 43B has an annular shape in the axial direction. Each of the pair of peripheral wall side connecting members 43A and 43B is provided between the first peripheral wall 41 and the second peripheral wall 42. Each of the pair of peripheral wall side connecting members 43A and 43B extends continuously over the entire outer periphery of the first peripheral wall 41.

The pair of peripheral wall side connecting members 43A and 43B are provided at intervals in a vertical direction. Hereinafter, among the pair of upper and lower peripheral wall side connecting members 43A and 43B, a peripheral wall side connecting member 43A on an upper side is also referred to as an "upper peripheral wall side connecting member 43A," and a peripheral wall side connecting member 43B on a lower side is also referred to as a "lower peripheral wall side connecting member 43B." The upper peripheral wall side connecting member 43A is provided between an outer periphery of an upper end of the first peripheral wall 41 and an inner periphery of an upper end of the second peripheral wall 42. The lower peripheral wall side connecting member 43B is provided between an outer periphery of a lower end of the first peripheral wall 41 and an inner periphery of a lower end of the second peripheral wall 42.

For example, the cover 3 is formed of a metal such as aluminum. For example, from the viewpoint of improving plasma resistance (resistance of the cover 3 to plasma), an inner surface of the cover 3 (the lower surface of the first top wall 35 and an inner peripheral surface of the first peripheral wall 41) is preferably covered with a film. For example, examples of the film for improving the plasma resistance include sprayed films of yttria ($Y_2O_3$), alumina ($Al_2O_3$), and the like.

<Heater>

The heaters 4A and 4B are provided only on the cover 3 among the chamber 2 and the cover 3. The heaters 4A and 4B are heat sources for heating the cover 3. The heaters 4A and 4B are not provided on the chamber 2. The plurality of heaters 4A and 4B are provided. The plurality of heaters 4A and 4B are provided on the upper structure 31 and the lower structure 32 of the cover 3. Hereinafter, the heater 4A provided in the upper structure 31 is also referred to as an "upper heater 4A," and the heater 4B provided in the lower structure 32 is also referred to as a "lower heater 4B."

The upper heater 4A is provided on the first top wall 35 of the cover 3. The upper heater 4A is a heat source for heating the first top wall 35. The upper heater 4A is attached to an upper surface of the first top wall 35. The upper heater 4A is provided in the upper space 30A in which atmospheric pressure can be maintained. The upper heater 4A is provided over the entire portion of the upper surface of the first top wall 35 facing the upper space 30A (a portion excluding a periphery of the top wall side connecting member 37).

The lower heater 4B is provided on the first peripheral wall 41 of the cover 3. The lower heater 4B is a heat source for heating the first peripheral wall 41. The lower heater 4B is attached to the outer peripheral surface of the first peripheral wall 41. The lower heater 4B is provided in the lower space 30B in which atmospheric pressure can be maintained. The lower heater 4B is provided over the entire portion of the outer peripheral surface of the first peripheral wall 41 facing the lower space 30B (a portion excluding a periphery of each of the pair of peripheral wall side connecting members 43A and 43B).

<Stage>

The stage 5 is provided in the processing room 20. The stage 5 is supported by the chamber bottom wall 27. The stage 5 has the placement surface 10 on which the substrate 9 is placed. For example, the substrate 9 is a semiconductor wafer. The stage 5 also functions as a lower electrode 11 for making an etching gas into plasma when the substrate 9 is etched.

<Pressure Adjusting Device>

The pressure adjusting device 6 has exhaust ports 50A and 50B that open to the processing room 20. The pressure adjusting device 6 can adjust pressure in the processing room 20. For example, the pressure adjusting device 6 is a depressurizing device capable of depressurizing the processing room 20. The pressure adjusting device 6 includes an exhaust structure 51, a first pump 52, and a second pump 53.

The exhaust structure 51 includes a plurality of (for example, three in the present embodiment) pipes 55 (only two are shown in the drawing) that communicate with the processing room 20, a first connecting pipe 56 that connects the plurality of pipes 55 and the first pump 52 to each other, and a second connecting pipe 57 that connects the first pump 52 and the second pump 53 to each other.

The pipes 55 extend in the vertical direction (the axial direction). The plurality of pipes 55 are disposed at intervals along the outer periphery of the stage 5. Here, an angle formed by the centers of the two pipes 55 adjacent to each other in the circumferential direction and the center of the chamber 2 is defined as a "central angle." For example, the three pipes 55 are disposed to form a central angle of approximately 120°. That is, the three pipes 55 are disposed at substantially equal intervals in the circumferential direction.

The first pump 52 and the second pump 53 are pumps for evacuating the processing room 20. For example, the first pump 52 is a turbo molecular pump (TMP). For example, the second pump 53 is a dry pump (DP).

The exhaust ports 50A and 50B are disposed below the placement surface 10. The plurality of exhaust ports 50A and 50B are provided. The plurality of exhaust ports 50A and 50B include first exhaust ports 50A which communicate between the outer periphery of the stage 5 and an inner periphery of the cover 3, and second exhaust ports 50B which communicate between an outer periphery of the cover 3 and an inner periphery of the chamber 2.

Each of the first exhaust ports 50A and each of the second exhaust ports 50B are provided in one of the pipes 55. An upper end of each pipe 55 is disposed between the outer periphery of the stage 5 and an inner periphery of the first peripheral wall 41. The first exhaust port 50A is provided at the upper end of the pipe 55. A part of an outer side surface of the pipe 55 is disposed between an upper edge of the communication hole 45 of the first peripheral wall 41 and an upper surface of the chamber bottom wall 27. The second exhaust port 50B is disposed in the part of the outer side surface of the pipe 55. The second exhaust port 50B overlaps the communication hole 45 in the radial direction.

<Plasma Generation Structure>

The substrate processing apparatus 1 further includes the lower electrode 11 (a first electrode) and an upper electrode 12 (a second electrode) which are capable of generating plasma in the processing room 20. The lower electrode 11 and the upper electrode 12 are provided in the processing room 20.

The lower electrode 11 has the placement surface 10 on which the substrate 9 is placed. The lower electrode 11 constitutes an upper end portion of the stage 5.

The upper electrode 12 faces the placement surface 10. The upper electrode 12 is provided to be separated upward from the lower electrode 11. The upper electrode 12 is attached to the lower surface of the first top wall 35. The upper electrode 12 has substantially the same size as the lower electrode 11 in the axial direction. The substrate processing apparatus 1 is configured to be capable of generating plasma between the lower electrode 11 and the upper electrode 12.

For example, when the substrate 9 is etched, the processing room 20 is evacuated by the pressure adjusting device 6. As a result, the processing room 20 is maintained at a predetermined low pressure (for example, low vacuum). For example, when the processing room 20 is evacuated, air is exhausted through the first exhaust port 50A at the upper end of the pipe 55 (see arrow V1 in the drawing) and is exhausted through the second exhaust port 50B and the communication hole 45 on the outer side surface of the pipe 55 (see arrow V2 in the drawing). As a result, the processing room 20 including the inside and the outside (between the cover 3 and the chamber 2) of the cover 3 reaches the predetermined low pressure.

The etching gas is introduced into the processing room 20 from a gas introduction part (not shown) while the processing room 20 is maintained at the predetermined low pressure. Next, the introduced etching gas is made into plasma by the lower electrode 11 and the upper electrode 12, and the substrate 9 is etched. For example, the chamber 2 is controlled to a target temperature by a circulating fluid which is supplied from a temperature control device (not shown).

For example, in the processing room 20, capacitively coupled plasma is generated by a radio frequency (RF) electric field being applied between the lower electrode 11 and the upper electrode 12. The plasma which is generated between the lower electrode 11 and the upper electrode 12 is not limited to the capacitively coupled plasma, but may be electron cyclotron resonance plasma, helicon wave excited plasma, inductively coupled plasma, microwave excited surface wave plasma, or the like.

<Effect>

As described above, the substrate processing apparatus 1 of the present embodiment includes the chamber 2 having a processing room 20 for processing the substrate 9, a cover 3 which is provided in the processing room 20 and is provided between the substrate 9 and the chamber 2, and the heaters 4A and 4B which are provided only on the cover 3 among the chamber 2 and the cover 3 and heat the cover 3.

According to this configuration, the heaters 4A and 4B are provided only on the cover 3, and thus it is possible to selectively heat the cover 3 having less heat dissipation than the chamber 2. Therefore, it is possible to suppress wasteful energy consumption (for example, electric power) as compared with a case in which the heaters 4A and 4B are provided in the chamber 2 (a case in which the chamber 2 larger than the cover 3 is heated). Therefore, it is possible to save energy saving.

Further, when the heaters 4A and 4B heat the cover 3, it is possible to prevent foreign matter generated in the processing of the substrate 9 from adhering to the cover 3.

In addition, since the cover 3 is smaller than the chamber 2, it is easy to heat the cover 3 to a high temperature. Therefore, it is possible to more effectively prevent foreign matter generated in the processing of the substrate 9 from adhering to the cover 3. Therefore, adhered substances are less likely to occur on the cover 3, and thus maintainability of the cover 3 is improved.

In the present embodiment, the cover 3 includes the first top wall 35 which faces the upper surface of the substrate 9, and the tubular first peripheral wall 41 which is connected to the outer periphery of the first top wall 35 and surrounds the outer periphery of the substrate 9. The heaters 4A and 4B are provided on the first top wall 35 and the first peripheral wall 41.

Therefore, it is possible to prevent foreign matter generated in the processing of the substrate 9 from adhering to each of the first top wall 35 and the first peripheral wall 41. As a result, adhered substances are less likely to occur on each of the first top wall 35 and the first peripheral wall 41, and thus maintainability of the cover 3 is further improved.

In the present embodiment, the chamber 2 includes the chamber upper wall 25 which is provided at a distance from the second top wall 36, and the chamber upper peripheral wall 26 and the chamber lower peripheral wall 28 which are provided at a distance from the second peripheral wall 42.

Therefore, according to the present embodiment, as compared with a case in which the chamber upper wall 25 is in contact with the second top wall 36, and the chamber upper peripheral wall 26 and the chamber lower peripheral wall 28 are in contact with the second peripheral wall 42, heat dissipation is small, and thus it is possible to suppress wasteful energy consumption. Therefore, it is possible to further save energy.

Further, in a case in which the space between the cover 3 and the chamber 2 is evacuated, even in a case in which the cover 3 is heated by the heaters 4A and 4B, heat dissipation to the chamber 2 is small due to vacuum insulation. Therefore, temperature control in a vacuum space can be realized with energy saving.

In the present embodiment, the cover 3 has the internal spaces 30A and 30B in which atmospheric pressure can be maintained. The heaters 4A and 4B are provided in the internal spaces 30A and 30B.

Therefore, the operating environment of the heaters 4A and 4B can be maintained. For example, even in a case in which the space between the cover 3 and the chamber 2 is evacuated, the internal spaces 30A and 30B are maintained at atmospheric pressure, and thus the heaters 4A and 4B can be driven stably.

In the present embodiment, the substrate processing apparatus 1 further includes the stage 5 which is provided in the processing room 20 and has the placement surface 10 on which the substrate 9 is placed, and the pressure adjusting device 6 which has the exhaust ports 50A and 50B that open to the processing room 20 and which is capable of adjusting the pressure of the processing room 20. The exhaust ports 50A and 50B are disposed below the placement surface 10.

Therefore, according to the present invention, as compared with a case in which the exhaust ports 50A and 50B are disposed above the placement surface 10, it is possible to prevent foreign matter from adhering to the substrate 9 due to the rise of the deposits on the placement surface 10.

In the present embodiment, the plurality of exhaust ports 50A and 50B are provided. The plurality of exhaust ports 50A and 50B include the first exhaust port 50A which communicates between the outer periphery of the stage 5 and the inner periphery of the cover 3, and the second exhaust port 50B which communicates between the outer periphery of the cover 3 and the inner periphery of the chamber 2.

Therefore, it is possible to make the pressure in the space between the outer periphery of the stage 5 and the inner periphery of the cover 3 at a predetermined low pressure with the exhausting through the first exhaust port 50A, and, at the same time, it is possible to make the pressure in the space between the outer periphery of the cover 3 and the inner periphery of the chamber 2 at a predetermined low pressure with the exhausting through the second exhaust port 50B.

Further, with the flow of the exhausting through the first exhaust port 50A and the second exhaust port 50B, it is possible to separate an inside portion (an inside space) of the cover 3 and an outside portion (an outside space) of the cover 3 in the processing room 20 from each other. Therefore, even in a case in which the inside space is a plasma space, the outside space can be maintained in a vacuum space.

In the present embodiment, the plurality of exhaust ports 50A and 50B are disposed at intervals along the outer periphery of the stage 5.

Therefore, it is possible to smoothly exhaust air from the processing room 20 through the plurality of exhaust ports 50A and 50B.

Further, in the present embodiment, the plurality of exhaust ports 50A and 50B are disposed at equal intervals in the circumferential direction, and thus it is possible to suppress deviation of the exhausting and to evenly exhaust air from the processing room 20.

In the present embodiment, the substrate processing apparatus 1 further includes the lower electrode 11 which is provided in the processing room 20 and has the placement surface 10 on which the substrate 9 is placed, and the upper electrode 12 which faces the placement surface 10. The substrate processing apparatus 1 is configured to be capable of generating plasma between the lower electrode 11 and the upper electrode 12.

Therefore, it is possible to save energy in an apparatus (a plasma etching apparatus) that etches the substrate 9 through a dry process using plasma.

OTHER EMBODIMENTS

In the above-described embodiment, an example in which the heater is provided on the first top wall and the first peripheral wall has been described, but the present invention is not limited to this. For example, the heater may be provided on the first top wall and may not be provided on the first peripheral wall. For example, the heater may be provided on the first peripheral wall and may not be provided on the first top wall. For example, an installation aspect of the heater can be changed according to a required specification.

In the above-described embodiment, an example in which the chamber includes the chamber upper wall which is provided at a distance from the second top wall, and the chamber upper peripheral wall and the chamber lower peripheral wall which are provided at a distance from the second peripheral wall has been described, but the present invention is not limited to this. For example, the chamber upper wall may be separated from the second top wall, and the chamber upper peripheral wall and the chamber lower peripheral wall may be in contact with the second peripheral wall. For example, the chamber upper wall may be in contact with the second top wall, and the chamber upper peripheral wall and the chamber lower peripheral wall may be separated from the second peripheral wall. For example, an installation aspect of the chamber upper peripheral wall and the chamber lower peripheral wall can be changed according to a required specification.

In the above-described embodiment, an example in which the cover has the internal space in which atmospheric pressure can be maintained, and the heater is provided in the internal space has been described, but the present invention is not limited to this. For example, the cover may not have the internal space. For example, in a case in which the heater has resistance to the predetermined low pressure, the heater may be exposed in the processing room. For example, an installation aspect of the heater can be changed according to a required specification.

In the above-described embodiment, an example in which the exhaust port is disposed below the placement surface has been described, but the present invention is not limited to this. For example, the exhaust port may be disposed above the placement surface. For example, a disposition aspect of the exhaust port can be changed according to a required specification.

In the above-described embodiment, an example in which the plurality of exhaust ports include the first exhaust port which communicates between the outer periphery of the stage and the inner periphery of the cover, and the second exhaust port which communicates between the outer periphery of the cover and the inner periphery of the chamber has been described, but the present invention is not limited to this. For example, only one exhaust port may be provided at a portion that communicates between the outer periphery of the stage and the inner periphery of the cover and communicates between the outer periphery of the cover and the inner periphery of the chamber. For example, the exhaust port may open to the upper surface of the chamber bottom wall. For example, an installation aspect of the exhaust port can be changed according to a required specification.

In the above-described embodiment, an example in which three exhaust ports are disposed at intervals along the outer periphery of the stage has been described, but the present invention is not limited to this. For example, two or less or four or more exhaust ports may be provided. For example, the installation number of the exhaust ports can be changed according to a required specification.

In the above-described embodiment, an example in which the substrate processing apparatus is configured to be capable of generating plasma between the lower electrode and the upper electrode has been described, but the present invention is not limited to this. For example, the substrate processing apparatus may not include the lower electrode and the upper electrode. For example, a configuration aspect of the substrate processing apparatus can be changed according to a required specification.

In the above-described embodiment, as an example of a substrate processing apparatus, an apparatus (a plasma etching apparatus) that etches a semiconductor wafer through a dry process using plasma has been described, but the present invention is not limited to this. For example, the substrate processing apparatus may be applied to an apparatus that does not use plasma.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A substrate processing apparatus comprising:
   a chamber which has a processing room in which a substrate is processed;
   a cover which is provided in the processing room and is provided in a place between the substrate and the chamber; and
   a heater which is provided only on the cover and the heater heats the cover,
   wherein the cover has an upper structure and a lower structure
   the upper structure includes a first top wall that faces an upper surface of the substrate, a second top wall that faces the first top wall, a top wall side connecting member that connects the first top wall and the second top wall to each other, and an upper space that is a space between the first top wall, the second top wall, and the top wall side connecting member,
   the lower structure includes a first peripheral wall that surrounds an outer periphery of the substrate, a second peripheral wall that surrounds an outer periphery of the first peripheral wall, a pair of peripheral wall side connecting members that connect the first peripheral wall and the second peripheral wall to each other, and an lower space is a space between the first peripheral wall, the second peripheral wall, and the pair of peripheral wall side connecting members;
   wherein the upper space and the lower space, in which atmospheric pressure can be maintained, and
   wherein the heater is provided in the upper space and lower space,
   wherein the second top wall is provided at a distance from a chamber upper wall,
   wherein the second peripheral wall is provided at a distance from a chamber peripheral wall,
   wherein a space between the cover and the chamber is evacuated.

2. The substrate processing apparatus according to claim 1, further comprising:
   a stage which is provided in the processing room and has a placement surface on which the substrate is placed; and
   a pressure adjusting device which has an exhaust port that opens in the processing room, which includes pumps for evacuating the processing room and an exhaust structure and which is capable of adjusting pressure in the processing room,
   wherein the exhaust port is disposed below the placement surface.

3. The substrate processing apparatus according to claim 2,
   wherein a plurality of exhaust ports are provided, and
   wherein the plurality of exhaust ports include
   a first exhaust port which communicates between an outer periphery of the stage and an inner periphery of the cover, and
   a second exhaust port which communicates between an outer periphery of the cover and an inner periphery of the chamber.

4. The substrate processing apparatus according to claim 2,
   wherein a plurality of the exhaust ports are disposed at intervals along an outer periphery of the stage.

5. The substrate processing apparatus according to claim 1, further comprising:
   a first electrode which is provided in the processing room and has a placement surface on which the substrate is placed; and
   a second electrode which faces the placement surface,
   wherein plasma can be generated between the first electrode and the second electrode.

* * * * *